(12) United States Patent
Dionne et al.

(10) Patent No.: US 9,476,920 B2
(45) Date of Patent: Oct. 25, 2016

(54) METHODS AND DEVICES FOR DETERMINING ROOT MEAN SQUARE OF A DELTA-SIGMA MODULATED SIGNAL

(71) Applicant: Smart Energy Instruments Inc., Oakville (CA)

(72) Inventors: Donald Jeffrey Dionne, Oakville (CA); Jennifer Marie McCann, Oakville (CA); Brian Leonard William Howse, Oakville (CA)

(73) Assignee: Smart Energy Instruments Inc., Oakville (CA)

( * ) Notice: Subject to any disclaimer, the term of this patent is extended or adjusted under 35 U.S.C. 154(b) by 0 days.

(21) Appl. No.: 14/761,984

(22) PCT Filed: Dec. 2, 2013

(86) PCT No.: PCT/CA2013/050923
§ 371 (c)(1),
(2) Date: Jul. 20, 2015

(87) PCT Pub. No.: WO2015/081411
PCT Pub. Date: Jun. 11, 2015

(65) Prior Publication Data
US 2015/0316587 A1     Nov. 5, 2015

(51) Int. Cl.
*G01R 19/02*     (2006.01)
*H03M 3/00*     (2006.01)
*G01R 21/133*     (2006.01)

(52) U.S. Cl.
CPC ............. *G01R 19/02* (2013.01); *G01R 21/133* (2013.01); *H03M 3/378* (2013.01)

(58) Field of Classification Search
CPC ..... G01R 19/02; G01R 19/003; G01R 19/2506; G01R 19/2513; G01R 21/133; G06F 7/602
USPC ................. 324/76.19, 76.28, 76.38; 375/131
See application file for complete search history.

(56) References Cited

U.S. PATENT DOCUMENTS

| | | | |
|---|---|---|---|
| 6,359,576 B1 | 3/2002 | Petrofsky et al. | |
| 6,628,720 B1 | 9/2003 | Sekii | |
| 2007/0297537 A1* | 12/2007 | Luce | H04L 27/0014 375/322 |

OTHER PUBLICATIONS

WIPO, International Search Report and Written Opinion relating to application No. PCT/CA2013/050923 dated Aug. 22, 2014.

* cited by examiner

*Primary Examiner* — Vincent Q Nguyen
(74) *Attorney, Agent, or Firm* — Rowand LLP (57) ABSTRACT

Described is a method and devices to determine root-mean-square of a delta-sigma modulated signal. The method includes filtering the delta-sigma modulated signal to produce a multi-bit filtered signal, delaying a copy of the delta-sigma modulated signal by a fixed number of samples to align with the filtered input, setting a sign of each multi-bit value of the multi-bit filtered signal based upon a corresponding sample value of the delayed copy of the delta-sigma modulated signal, to generate a hybrid signal, summing the hybrid signal to produce a summed signal, and determining the average of the summed signal and the square root of the average to produce a root-mean-square value.

19 Claims, 5 Drawing Sheets

Fig. 1

PRIOR ART

Fig. 6

METHODS AND DEVICES FOR DETERMINING ROOT MEAN SQUARE OF A DELTA-SIGMA MODULATED SIGNAL

FIELD

The present application generally relates to power measurement and to methods and devices for determining root mean square (RMS) and, in particular, to determining RMS with respect to a delta-sigma modulated signal.

BACKGROUND

RMS measurements are often used when assessing a signal. Typical RMS calculators require a squaring operation, summation and division, and a square root operation. When dealing with high-speed sampling of signals, it important to realize circuits that operate quickly with high dynamic range and that avoid unnecessary complexity.

Bitstreams, such as delta-sigma modulated signals, present a difficulty for RMS calculations. Direct multiplication of bitstreams is not possible without converting the signal to a multi-bit domain or employing single-bit techniques that add significant noise. Accordingly, implementing an RMS calculator for a delta-sigma modulated signal often requires use of a high-speed multi-bit multiplier, which is costly in terms of hardware resources.

It would be advantageous to provide for alternative methods and devices for determining RMS values for bitstream signals.

BRIEF DESCRIPTION OF THE DRAWINGS

Reference will now be made, by way of example, to the accompanying drawings, which show example embodiments of the present application, and in which.

DESCRIPTION OF EXAMPLE EMBODIMENTS

In one aspect, the present application discloses a method of determining root-mean-square of a delta-sigma modulated signal. The method includes filtering the delta-sigma modulated signal to produce a multi-bit filtered signal; delaying a copy of the delta-sigma modulated signal by a fixed number of samples to align with the filtered input; setting a sign of each multi-bit value of the multi-bit filtered signal based upon a corresponding sample value of the delayed copy of the delta-sigma modulated signal, to generate a hybrid signal; summing the hybrid signal to produce a summed signal; and determining the average of the summed signal and the square root of the average to produce a root-mean-square value.

In another aspect, the present application discloses a measurement device to determine the root-mean-square of a delta-sigma modulated signal. The device includes a low-pass filter to filter the delta-sigma modulated signal and output a multi-bit filtered signal; a delay path to delay a copy of the delta-sigma modulated signal by a fixed number of samples to align with the multi-bit filtered signal; a logic operator to set a sign of the multi-bit filtered signal based on the delayed copy of the delta-sigma signal, to produce a hybrid signal; an accumulator to sum the hybrid signal to produce a summed signal; and a square root operator to average the summed signal and to output an RMS value as the square root of the averaged summed signal.

In yet another aspect, the present application includes non-transitory computer-readable media containing processor-executable instructions for carrying out one or more of the methods described herein.

Other aspects and features of the present application will be understood by those of ordinary skill in the art from a review of the following description of examples in conjunction with the accompanying figures.

Figure 1:
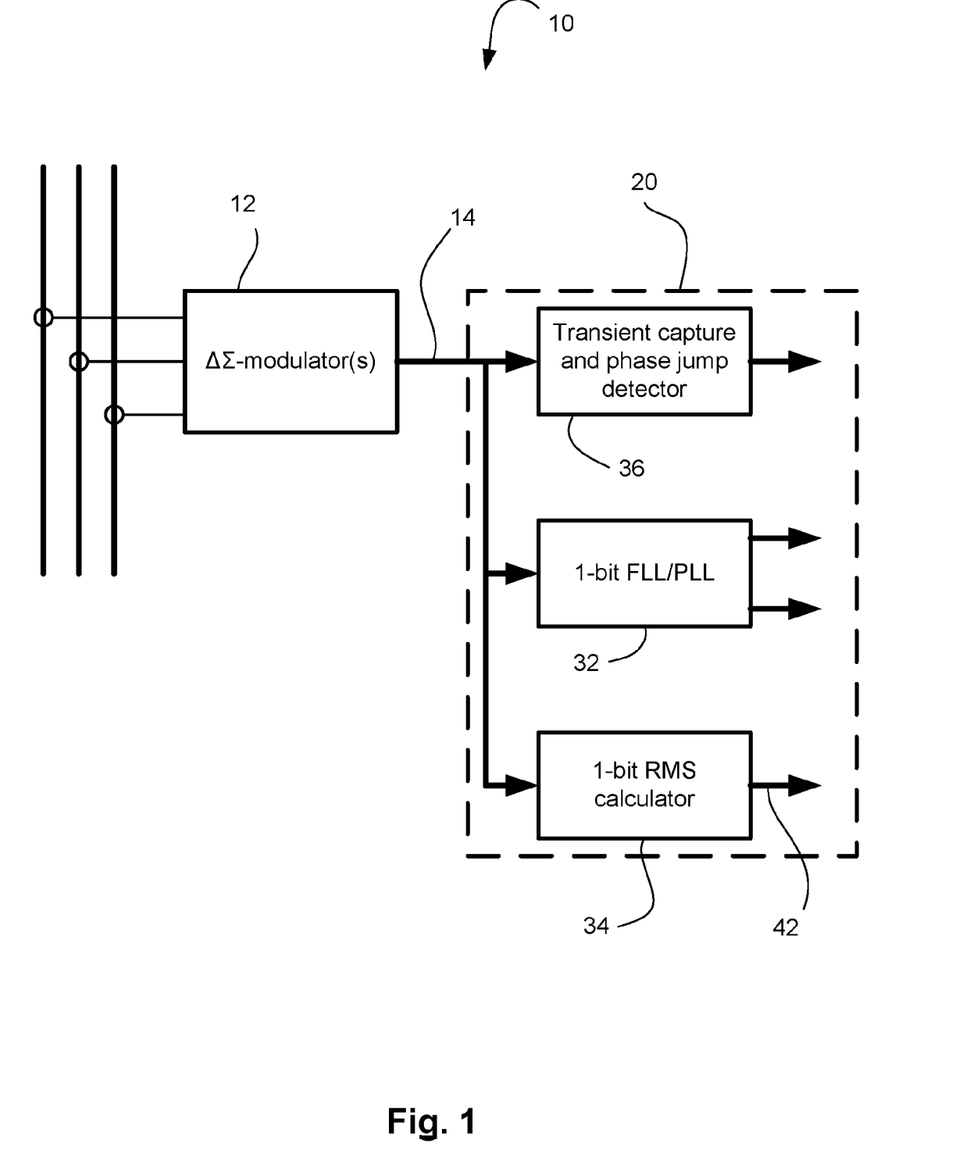
FIG. 1 shows a block diagram of an example of a power measurement device that includes an RMS calculator.

Reference is first made to FIG. 1, which shows a simplified block diagram of a power measurement device 10. The device 10 includes a 1-bit Delta-Sigma Modulator (DSM) 12 for measuring the power quantity (voltage and/or current on one of the phases) and producing a 1-bit signal or bitstream 14. It will be understood that conventional delta-sigma converters employ a low-pass filter at the output to remove the high frequency shaped quantization noise components of the delta-sigma modulation when converting bitstream to multi-bit data. In some embodiments, the device 10 does not employ such low pass filtering but, instead, retains the high frequency components. As noted above, for simplicity a single DSM 12 is illustrated in FIG. 1. Some implementations may have two or more delta-sigma modulators for measuring current and voltage signals on one or more phases. In the case of a three-phase three-wire system, six DSMs may be used so as to measure current and voltage on all three phases. Similarly, in the case of a three-phase four-wire system, eight delta-sigma modulators may be used so as to measure current and voltage on all three phases and the neutral.

The device 10 includes a signal processor 20. The signal processor 20 receives the bitstream 14 and performs signal analysis and measurements as described in greater detail below. In particular, the signal processor 20 is implemented to operate on the 1-bit DSM output bitstream 14 directly.

The signal processor 20 produces high accuracy synchrophasor measurements of the power system fundamental. It may also selectively detect and measure subgroup harmonics present (selected by power content), perform transient detection, and perform both single bit and multiple bit waveform capture.

The signal processor 20 includes a 1-bit dual frequency locked-loop (FLL) and phase-locked-loop (PLL) 32 architecture. The 1-bit FLL/PLL 32 outputs phasor data, such as a frequency signal and a phase signal. It will be understood that in the case of a polyphase system, there may be multiple phase signals. It will also be understood that in some implementations more than one frequency signal may be output, such as one signal measured from a voltage transformer signal, and another from a current transformer signal. It may also be noted that in some embodiments it may be advantageous to have more than 1 FLL. For example, if the measurement device 10 were configured for use as a Synchro Check device to confirm that a new power generation source is at the correct phase before connection to the system. Examples of the 1-bit FLL/PLL are described in US Patent Publication No. 2012-0200284-A1 to Dionne, entitled "Power Measurement Device", the contents of which are hereby incorporated by reference.

The signal processor 20 also includes a transient capture and phase jump detection component 36. The transient capture and phase jump detection component 36 is configured to detect possible transients in the bitstream 14.

The signal processor 20 further includes a 1-bit RMS calculator 34. The RMS calculator 34 calculates the root-mean-square value of the input DSM bitstream, thereby producing an RMS signal 42.

The signal processor 20 may receive a clock correction signal for accurately correcting local oscillators (not illustrated). The signal processor 20 may incorporate the correction factor from the clock correction signal into a frequency/phase locked loop used to measure frequency and phase of the bitstream 14 signal, and thereby producing accurate synchronized phasor (synchrophasor) measurements. In other embodiments, the local oscillator may be used more directly. Example methods and devices for correcting clock signals are described in PCT patent application serial no. PCT/CA2013/050912, to Dionne et al., filed Nov. 28, 2013, the contents of which are hereby incorporated by reference.

The device 10 may also include a memory or buffer (not shown) for storing measurement data. It also includes a communication subsystem (not shown) for communicating with a remote location. The communication subsystem may implement any of a variety of communication protocols and physical layer connections. In one example embodiment, the communication subsystem may implement Ethernet (10/100 or Gigabit, for example), GSM, 802.11 WiFi, USB, etc. In some implementations the communication subsystem may operate in accordance with two or more communication protocols.

The signal processor 20 may be implemented in a number of ways. In some embodiments, the signal processor 20 may be implemented using a field programmable gate array (FPGA). In some embodiments, it may be implemented using a suitable programmed general purpose microcontroller or microprocessor. In yet other embodiments, it may be implemented using a digital signal processor. In yet further embodiments, it may be implemented using an application-specific integrated circuit (ASIC). In some embodiments, the foregoing may be supplemented with discrete analog and/or digital components for implementing certain operations or aspects of the signal processor 20. The full range of possibilities will be apparent to those of ordinary skill in the art in light of the following description.

It will be appreciated that the simplified diagram shown in FIG. 1 omits a number of components or elements that may be included in the device 10, such as debugging circuitry, local oscillator and/or correction circuitry for an internal clock, isolation hardware, power source circuitry, etc.

Figure 2:
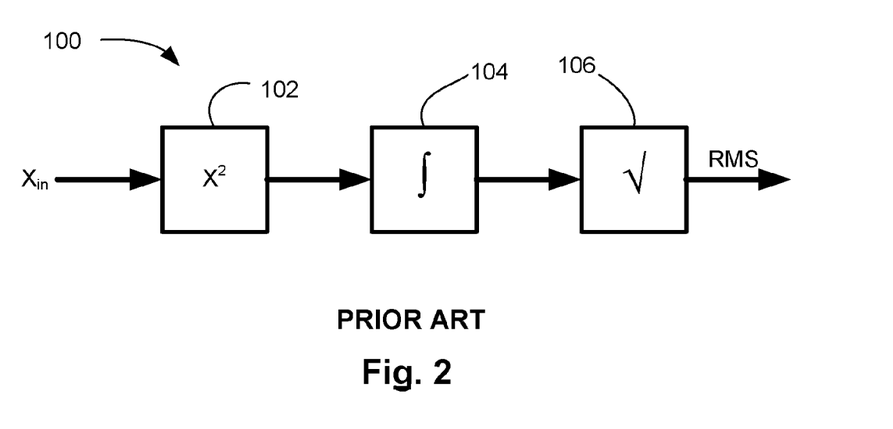
FIG. 2 shows an example of a conventional RMS calculator.

Reference is now made to FIG. 2, which shows a simplified block diagram of a conventional RMS calculator 100. In general, the RMS calculator 100 includes a square operator 102, an averaging operator 104, and a square root operator 106. For a continuous function, ƒ(t), for a time interval $T_1 \leq t \leq T_2$, the RMS calculator 100 provides an RMS output signal given by:

$$f_{rms} = \sqrt{\frac{1}{T_2 - T_1} \int_{T_1}^{T_2} f(t)^2 \, dt}$$

For a discrete signal, $x_n$, over a period of N samples/values, the RMS calculator 100 provides an RMS output signal given by:

$$x_{rms} = \sqrt{\frac{1}{N}(x_1^2 + x_2^2 + \ldots + x_{N-1}^2 + x_N^2)}$$

The squaring operator 102 shown in FIG. 2 multiplies the signal by itself. In the case of a discrete signal, the squaring operator 102 may be configured to perform multi-bit multiplication of each sample with itself.

The averaging operator 104 accumulates the squared values and determines an average squared value when divided by N. This may involve adding and division operations, in some implementations.

The square root operator 106 calculates the square root of the average value output by the averaging operator 104.

There are a number of ways to implement the RMS calculator 10 using discrete analog or digital logic components and/or software. In one example, the squaring operator 102 is a multi-bit multiplier to produce a squared input signal. In some cases, the averaging operator 104 for averaging the squared input signal is implemented using an operational amplifier configured with an RC averaging filter on the input. Other circuits may be used in other embodiments.

The square root operator 106 may be implemented in software in some cases. In one alternative, the square root operator 106 is implemented by taking advantage of the following algebraic transformation:

$$V_{RMS}^2 = \overline{V_{in}^2}$$

$$V_{RMS} = \frac{\overline{V_{in}^2}}{V_{RMS}}$$

Using a feedback loop from the output of the averaging operator 104, the squaring operator 102 is modified to include a division operation.

In any of the above-described RMS calculators, the complexity is dominated by the requirement for a multiplier in the squaring operator 102.

The use of a multiplier in the squaring operation also poses a problem for Delta-Sigma Modulated (DSM) signals. If, for example, the DSM signal is a signed +1 or −1 signal, then a squaring operation implemented at the bit rate of the DSM signal produces $(-1)^2=1$ and $(+1)^2=1$, which results in a DC constant output with loss of all encoded data in the signal. If, on the other hand, the DSM signal is an unsigned binary signal of 0 or 1, then squaring the signal produces $0^2=0$ and $1^2=1$, which has no effect on the bitstream.

Accordingly, in some cases DSM signals may be squared by filtering the bitstream signal and performing multi-bit multiplication on the filtered signal. There have been some attempts to implement multiplication of bitstreams within the single-bit domain using a network of single-bit adders, delays, and single-bit multipliers. At least one such example is described in H. Fujisaka et al., "Bit-stream signal processing and its application to communication systems", *IEEE Proceedings Circuits and Devices Systems*, vol. 149, No. 3, June 2002. A problem with the approach described by Fujisaka et al. is that DSM noise is not effectively removed and accumulates in each of the sub-product additions and propagates to the output. Accordingly, this type of network approach to single-bit multiplication has significant signal-to-noise limitations. As a result, these solutions are inadequate for incorporation into a high-accuracy RMS measurement device.

The arithmetic product of two bitstreams may be described as:

$$\left[\frac{1}{L}\sum_{i=n-L+1}^{n} x(i)\right]\left[\frac{1}{L}\sum_{j=n-L+1}^{n} y(j)\right]$$

In the above expression, $x(i)$ and $y(j)$ are the two bitstreams, and L is the time interval or window over which the product occurs. Prior to the multiplication, each of the bitstreams is averaged to recover the encoded signal in multiple-bit precision. However, this expression requires a multi-bit multiplier.

The mathematical structure of the above expression is similar to that of a finite impulse response (FIR) filter with coefficients $b_i$ given by the rectangular impulse response window of length L. If the coefficients $b_i$ are set to 1/L, then the application of the FIR filter to a signal $x[n]$ may be expressed as follows:

$$x_{out}[n] = \sum_{i=0}^{L} \frac{1}{L} x[n-i] = \frac{1}{L}\sum_{i=0}^{L} x[n-i] = \frac{1}{L}\sum_{i=n-L+1}^{n} x[i]$$

Notably, the FIR filter with rectangular impulse response of length L and height 1/L results in the same signal as that used in the arithmetic product expression for multiplying bitstreams. The gain parameter 1/L provides unit gain in the transfer function and can be eliminated by allowing an overall gain, K, where K=L with integer quantization rather than fractional fixed point. The optional gain parameter K may be set to 1 in some embodiments.

In accordance with one aspect of the present application, an RMS calculator for a DSM signal is proposed in which the squaring operation is implemented using a filtering operation on the input signal to produce a multi-bit precision filtered signal. The input signal is also delayed by a fixed number of samples and the delayed input signal is then multiplied with the multi-bit precision filtered signal that results from the filtering. The filtering operation filters out the DSM noise. The resulting signal is a hybrid signal with characteristics of a multi-bit precision signal and a delta-sigma modulated signal with shaped noise at high frequency. Because the DSM noise has been filtered from one of the squaring signals, the multiplication does not result in cross-convolution of DSM-shaped noise throughout the spectrum of the output signal. Moreover, the multiplication operation between the multi-bit precision filtered signal and the delayed DSM signal amounts to a sign operation. That is, the multiplication operation may be implemented without the use of costly multiplier, but instead by applying or setting a sign bit of the multi-bit precision filtered signal.

In one embodiment, the hybrid signal, $z[n]$, resulting from this operation may be expressed as:

$$z[n] = K\left[\frac{1}{L}\sum_{i=n-L+1}^{n} x(i)\right]\left[x\left(n-\frac{L}{2}\right)\right], \text{ where } K = L$$

In the above expression, the first term is a filtered version of the input DSM signal $x[n]$. The second term is a delayed copy of the DSM signal. L is the sampling window or time delay. The delayed copy of the DSM signal is delayed by a fixed delay of L/2. The second term is a +1 or −1 that changes the sign of the filtered multi-bit signal represented by the first term. The filter structure in the above expression is a simple rectangular impulse response of length L and height 1/L convolved with the input signal $x[n]$. This filter is commonly referred to as a moving average filter or a boxcar filter. It tends to maintain a sharp step response and eliminate white (random) noise. The resulting hybrid signal $z[n]$ contains both multi-bit precision and delta-sigma modulated shaped high frequency noise, which can be further filtered to produce a multi-bit precision result of the multiplication with gain K.

The time delay D is to realign the delayed signal with the filtered signal based on the propagation delay through the filter. A finite impulse response filter features a delay of half the number of taps, which, in the above example, results in D=L/2 (also may expressed as $z^{-D}$). Because D must be an integer, L must be an even number. As will be explained further below, it may also be advantageous in some embodiments if L is a power-of-two integer so that the gain, K, may be normalized using a bit shift operation.

The moving average filter is one example filter that may be used to generate the filtered multi-bit signal from the DSM signal, but it is not the only such filter. Another filter that may be used in some embodiments is a multiple-pass moving average filter, which has characteristics of a Gaussian filter and a Blackman window filter. In general, a suitable filter for the DSM signal is one in which the passband has no ripple and is linear phase, and which may be implemented without use of a multiplier.

Figure 3:
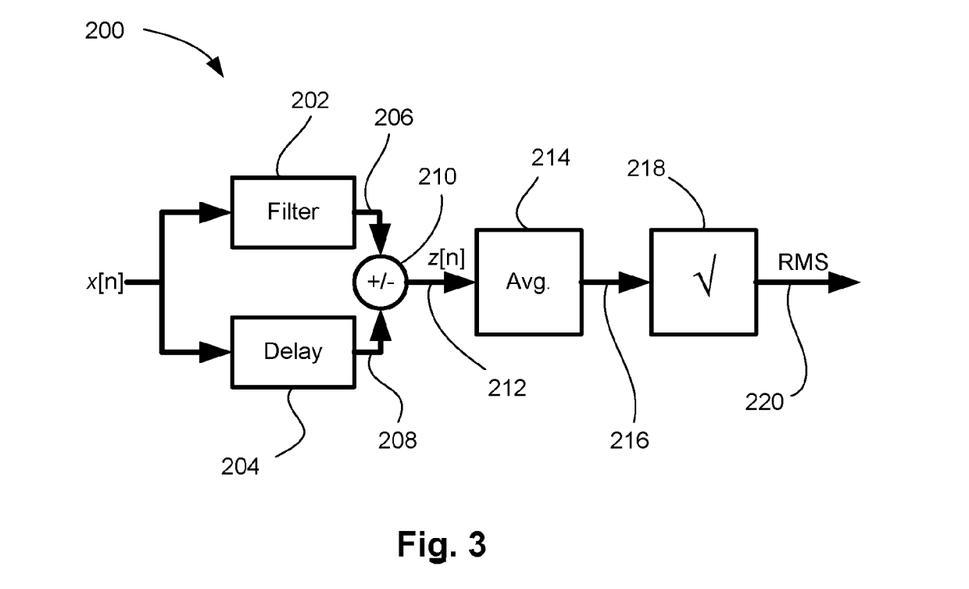
FIG. 3 shows a block diagram of an example of a 1-bit RMS calculator.

Reference is now made to FIG. 3, which shows, in block diagram form, an example embodiment of an RMS calculator 200 for a DSM signal. The DSM signal $x[n]$ is input to a filter 202 and to a delay operator 204. The filter 202 outputs a multi-bit signal 206. In this example, the filter 202 applies a gain factor K (for integer realization) and a filter transformation F(z), which in this example may be the boxcar filter described above. The delay 204 results in a delayed signal 208. The delay applied by the delay operator 204 is based on realigning the delayed signal 208 with the multi-bit signal 206, and thus is based on the delay within the filter 202. In one embodiment, the multi-bit signal 206 may have 24-bit equivalent precision.

In an example where the DSM signal $x[n]$ is a delta-sigma modulated sampling of a power system voltage or current signal, then the multi-bit signal 206 describes a sinusoid or a sinusoid with harmonics.

The delayed signal 208 is then used to set or adjust the sign of the multi-bit signal 206 so as to produce the hybrid signal 212, denoted $z[n]$. In principle, the multi-bit signal 206 is multiplied by the delayed signal 208, but because the delayed signal 208 is a DSM signal representing either −1 or +1, the multiplication is effectively a sign change/setting operation and can be implemented without requiring a multi-bit multiplier component. The combining operator is labeled 210. As noted, the combining operator 210 is effectively a sign setting operator for the multi-bit signal 206 based on the 1-bit delayed signal 208.

The RMS calculator 200 further includes an averaging operator 214 that receives the hybrid signal 212 and outputs an average signal 216. The averaging operator 214 performs the sum-of-squares portion of the RMS calculation. The averaging operator 214 may, in some instances, be implemented as an integrator. The averaging operator 214 may, in some embodiments, include a low pass filter before the integrator to remove the DSM noise portion of the signal; however, in some other embodiments the integrator itself may filter the high-frequency DSM noise since it is shaped and pushed to relatively high frequencies in the oversampling process. A first-order, single-pole integrator is sufficient as the averaging operator 214 to perform the sum-of-squares operation and filter DSM noise, in some embodiments. The averaging operator 214 may include an accumulator register for accumulating the sum of squares data from the hybrid signal 212, and a counter for maintaining a sample count.

The RMS calculator 200 further includes a square root operator 218 for receiving the average signal 216 and outputting a square root value 220. The square root operator 218 may be implemented by a suitably-programmed processor, ASIC, digital signal processing chip, or other computing element suitable for determining a square root of a multi-bit value. It will be noted that the square root operator 218 need not operate at the same speed as the rest of the RMS calculator 200. In some embodiments, the square root operator 218 may be configured to calculate a square root value 220 every pre-determined number of samples. In one example, the calculation may occur once for every million input samples, x[n].

In one example embodiment, the averaging operator 214 is implemented as an accumulator to perform a sum-of-squares operation. The averaging of the sum-of-squares through division of the sum by the number of samples may be implemented within the square root operator 218, in some embodiments, such that the output signal from the accumulator is a multi-bit modulated saw-tooth waveform. The sum in the accumulator will eventually overflow, so prior to overflow it is captured/stored and processed by dividing by a sample count N and finding the square root. The stored value may also or alternatively be used in a longer term averaging operation. The square root operator 218 may perform the averaging operation by dividing the accumulator value by a count N of the number of samples since a last reset/dump of the accumulator. The timing of the square root operator 218 performing the averaging operation may be configured to ensure that the division may be accomplished through a binary shift operation, in some cases.

Figure 4:
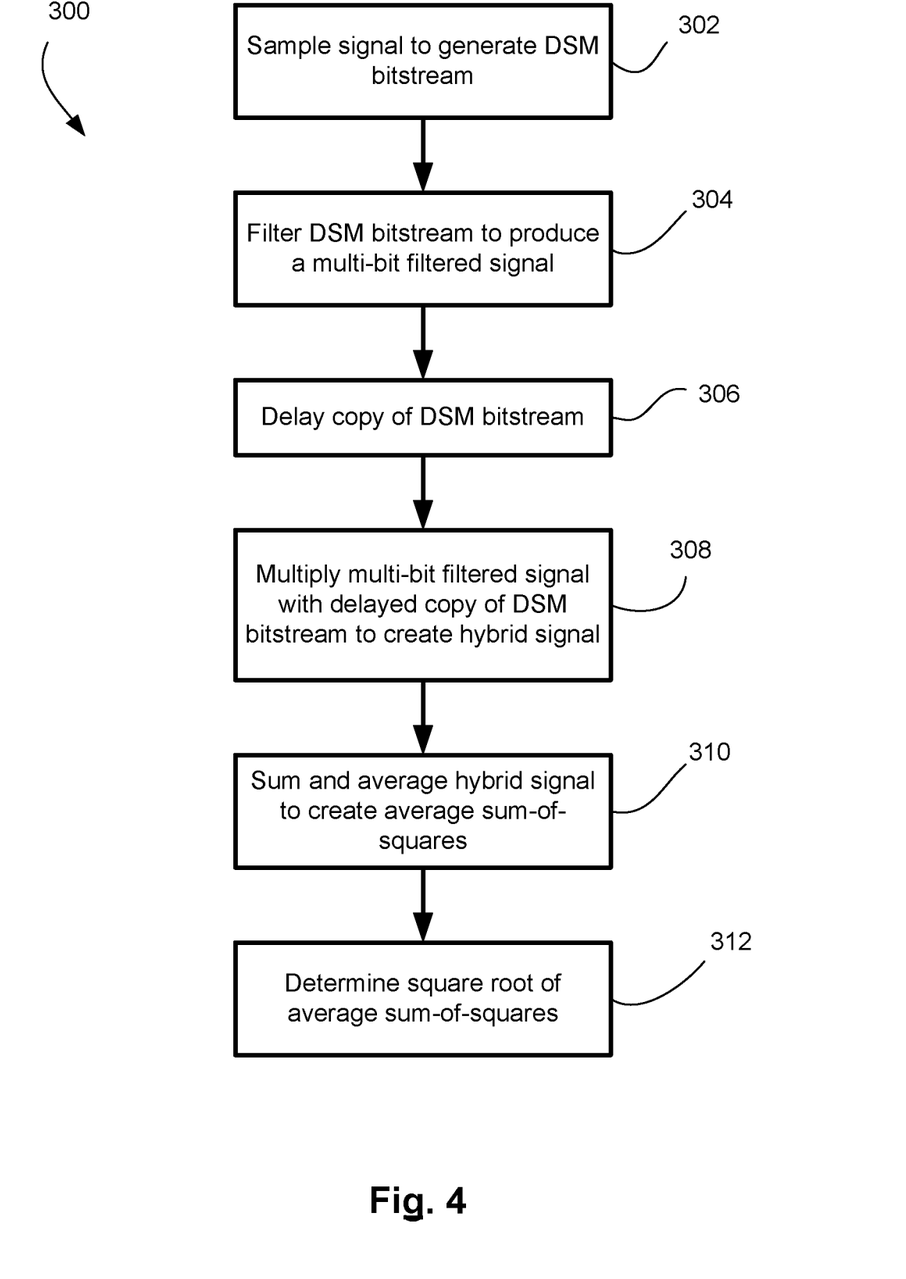
FIG. 4 shows, in flowchart form, an example method of determining RMS for a DSM bitstream.

Reference is now made to FIG. 4, which shows, in flowchart form, one example method 300 for determining RMS value for an input signal. The method 300 includes first generating the input signal through DSM sampling of a source signal to generate the DSM bitstream, as indicated by operation 302. The DSM bitstream is filtered in operation 304 to produce a multi-bit filtered signal. The filtering may be a low-pass filtering to eliminate the DSM noise. The output multi-bit filtered signal features a multi-bit sample for every DSM sample in the input signal. As noted above, in some embodiments, the filtering is implemented using a FIR filter. In one embodiment, the FIR filter is a moving average filter (i.e. boxcar filter). In some embodiments, the filter is a multiple pass moving average filter. In yet other embodiments, the filter may be a cascaded integrator-comb (CIC) filter. In whatever configuration, the filter is one which does not require multiplication.

In parallel with operation 304, a copy of the DSM bitstream is delayed by a delay element to produce a delayed DSM bitstream as indicated by operation 306. Although they are illustrated as being sequential in the flowchart, it will be appreciated that operations 304 and 306 occur concurrently. The delay imposed on the DSM bitstream is sufficient to realign the bitstream with the multi-bit filtered signal. In other words, the delay imposed is the same as the delay resulting from propagation of the DSM bitstream through the filter.

In operation 308, the multi-bit filtered signal and the delayed copy of the DSM bitstream are multiplied to create the signed hybrid signal. The multiplication in operation 308 may be implemented without actual discrete multipliers in many embodiments since effect of multiplying the multi-bit filtered signal by the DSM bitstream is simply a multiplication of the multi-bit samples by +1 or −1, i.e. a sign value. In some embodiments, the multiplication may be implemented by setting a sign bit or value based on the value of the delayed DSM bitstream.

The signed hybrid signal resulting from operation 308 is then averaged in operation 310 to implement the sum-of-squares/averaging operations. In some embodiments, an integrator may be used to implement the averaging operation 308. The averaging operation 310 removes any high frequency components of the hybrid signal and results in an average sum-of-squares signal. In operation 312, the square root is determined for the average sum-of-squares signal to produce a square root value.

In some embodiments, the division operation for averaging may be incorporated into the square root operation rather than in the sum-of-squares operation, such that the sum-of-squares is determined in operation 310 using, for example, an accumulator, and the total is divided by a count of samples accumulated in accumulator during operation 310 when calculating the square root value.

It will be appreciated that the sum-of-squares and sample count may be stored for determining RMS at a first time, T1, and the integrator and sample count may be cleared. Another sum-of-squares and sample count may then be determined and stored at a second time T2. The aggregate of those stored sums and sample counts provides RMS at time T1, T2, and T1+T2. This may be advantageous for determining both short-term and long-term averages with only one integrator and sample counter.

The above-described embodiments use the example of a moving average filter. As noted, other filters may also be used, including a multiple-pass moving average filter. Although the multiple-pass moving average filter increases the complexity of the circuit, it may result in improved stop-band attenuation. A corresponding adjustment to the delay D may be required to keep the filtered signal aligned with the delayed signal.

Figure 5A:
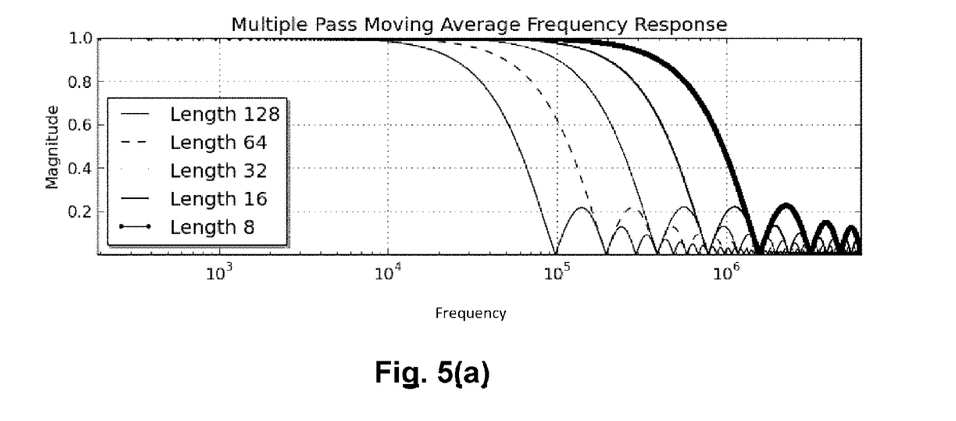
FIGS. 5(a) and 5(b) show example frequency responses relating to multiple-pass moving average filters.
Figure 5B:
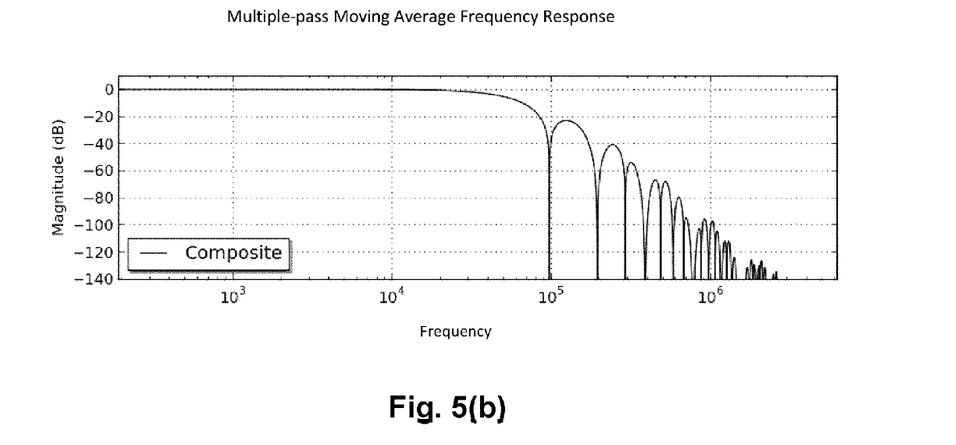

Reference is now made to FIGS. 5(*a*) and 5(*b*), which show frequency response charts. FIG. 5(*a*) is a frequency response chart showing the frequency responses of a plurality of moving average filters with different tap lengths on the rectangular window (lengths L=8, 16, 32, 64, and 128). Individually, each filter has a wide frequency pass band and periodic notches and return lobes in the stop band. The moving average filter with the longest tap length (L=128) has the narrowest pass band and relatively flat frequency response out to the stop band. Notably, the return lobes of filter with length $2^{N/2}$ align perfectly with the notch of a filter of length $2^N$, and the pass band of filter with length $2^{N/2}$ remains flat out past the filter of length $2^N$. As a result, cascading filters of length $2^n$ in multiple passes rapidly attenuates the stop band and yet maintains a very flat frequency response in the pass band.

FIG. 5(*b*) shows the frequency response of the composite filter formed by the five example filters of FIG. 5(*a*). The composite filter has pass band characteristics of component filter of length 128 and steep attenuation in the stop band due to component filters of length 64, 32, 16 and 8.

Accordingly, in some embodiments, the filter in the RMS calculator may be implemented using a multiple-pass moving average filter formed using a plurality of moving average filters, with each moving average filter having a tap length of $2^n$. Index n may be a set of integers with at least one of the filters having a length of $2^N$ and at least one of the filters having a length of $2^{N/2}$.

In a mathematical sense, a multiple-pass moving average filter is a cascade of the moving average filter expression, meaning the hybrid signal resulting from the multiple-pass moving average filter may be expressed as:

$$z[n] = K_{128}K_{64}K_{32}K_{16}K_8 \left[ \frac{1}{L_{128}} \sum_{i=n-L_{128}+1}^{n} \frac{1}{L_{64}} \sum_{i=n-L_{64}+1}^{n} \frac{1}{L_{32}} \sum_{i=n-L_{32}+1}^{n} \frac{1}{L_{16}} \sum_{i=n-L_{16}+1}^{n} \frac{1}{L_8} \sum_{i=n-L_8+1}^{n} x(i) \right]$$

$$\left[ y\left(n - \frac{L_{128}}{2} - \frac{L_{64}}{2} - \frac{L_{32}}{2} - \frac{L_{16}}{2} - \frac{L_8}{2}\right) \right]$$

In the above expression, in some embodiments $K_j = L_j$, such that the K's and L's in the first term cancel but with overall filter gain $K' = K_{128}K_{64}K_{32}K_{16}K_8$. Also, since $L_{N/2} = L_N/2$, the delay line in the second term is $y(n - L_{128}/2 - L_{128}/4 - L_{128}/8 - L_{128}/16 - L_{128}/32)$.

Expanding the fractions and collecting terms, the simplified expression is given by:

$$z[n] = K'\left[ \sum_{i=n-L_{128}+1}^{n} \sum_{i=n-L_{64}+1}^{n} \sum_{i=n-L_{32}+1}^{n} \sum_{i=n-L_{16}+1}^{n} \sum_{i=n-L_8+1}^{n} x(i) \right]\left[ y\left(n - \frac{31L_{128}}{32}\right) \right]$$

The above expression represents the DSM signal squaring operation in an RMS calculator with a multiple-pass moving average filter composed of moving average filters of lengths 8, 16, 32, 64, and 128. It will be appreciated that the gains K or K' in the above expressions are for the convenience of integer computations in a processing device. The gain may be removed either before averaging or in the division by N operation. If fractional fixed point calculations are used, such as in a DSP or FPGA or ASIC, then the gain may not be required and may be factored into the fractional bits. Note the multiplication operation still resolves to a simple sign setting/changing operation in view of the fact the second term of the expression is a delayed copy of the DSM signal. Each of the summations in the first terms may be optimized so that only a partial sum and difference is implemented due to the rectangular window in which all coefficients are identical. This simplification is explained further below.

The moving average filter, or multiple-pass moving average filter, using a rectangular window allows for some optimizations in terms of hardware and/or software implementation. For example, in the case of many FIR filters, symmetry in the filter response may allow for a folded FIR structure to be used, in which only half the coefficients are needed with a multiplication using two adds to sum symmetrically located input samples. When all coefficients are equal, additional simplifications may be used. Notably, when all coefficients $b_i=1$, such as in a simple rectangular window, the multiplication is not required and summation of the windowed input samples is all that is required to create the filter output.

Yet a further optimization is available when the coefficients are identical. Rather than summing the windowed samples on each iteration, the newly-captured sample is added to the previous summation and the sample newly-excluded from the window is subtracted from the summation. All the "middle" values between those ends remain the same and are re-used in the summation.

Accordingly, in some embodiments the summation is carried out using a holding buffer and adding the new x[n] sample and subtracting the old x[n−N+1] sample. A delay line may be used to locate and subtract x[n−N+1]. This simplification may result in significant hardware reduction that may motivate use of the moving average or multiple-pass moving average filters.

Figure 6:
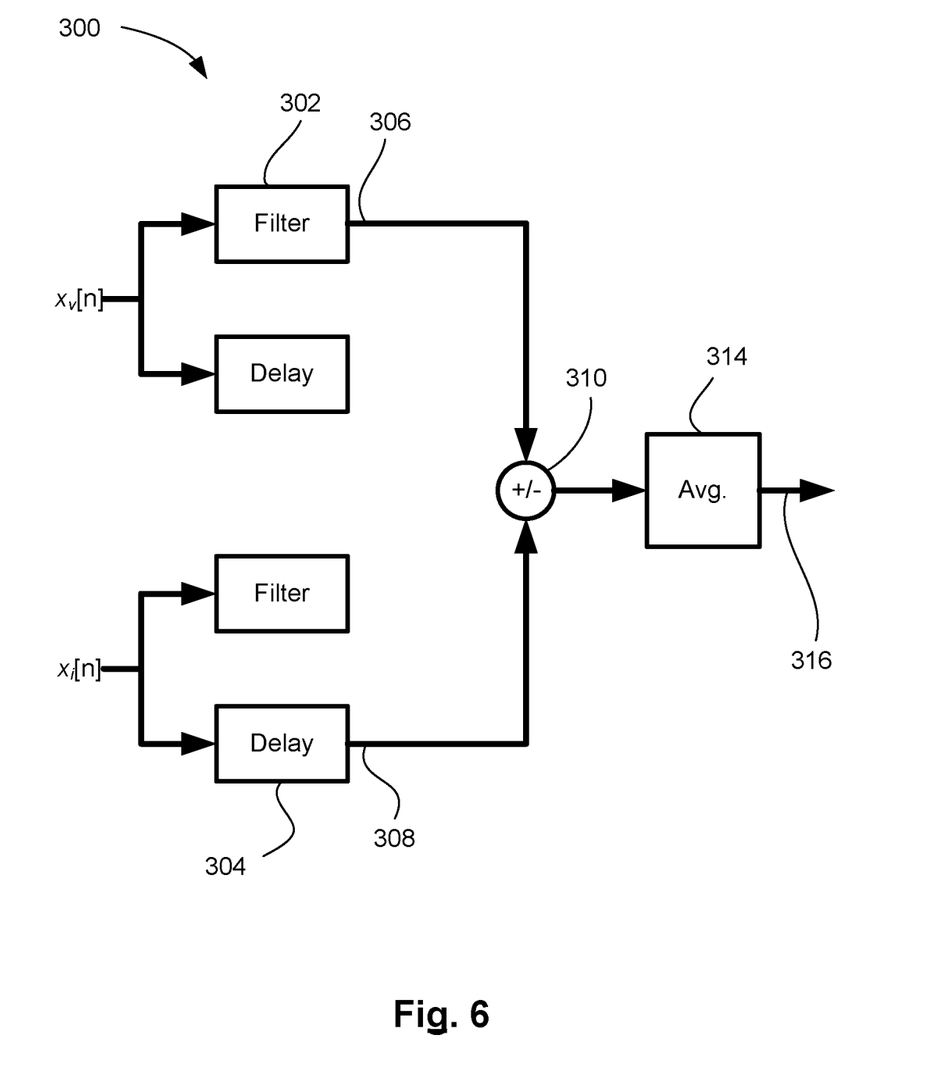
FIG. 6 shows an example block diagram for a power calculator using DSM bitstreams.

Reference is now made to FIG. 6, which shows an example block diagram of an embodiment of a power calculator 300 for 1-bit DSM signals. Because the DSM bitstreams are already subjected to filtering and delay for the purpose of RMS calculations, very little additional hardware is needed for also implementing a power calculator. In this example, the measurement device uses delta-sigma modulation to generate bitstreams representing the voltage and the current on a phase of the power system. The voltage bitstream is labeled $x_v[n]$ and the current bitstream is labeled $x_i[n]$. Real power can be calculated from the product of voltage and current. In order to carry out that calculation in the case of DSM sampled voltage and current, and avoid unnecessary multiplications, a portion of the RMS calculator architecture may be exploited.

In the RMS calculator, the DSM signals are filtered to produce the multi-bit filtered signals. They are also delayed to produce delayed signals. Accordingly, to "multiply" the current and voltage signals, the filtered multi-bit signal representing either current or voltage sampling is combined with the delayed DSM bitstream of the other of current or voltage to produce a signed multi-bit product value. The power calculator 300 thus includes a filter 302 to produce the multi-bit filtered signal 306 and a delay 304 on the other channel to produce the delayed DSM bitstream signal 308. The delayed DSM bitstream signal 308 is then combined with the multi-bit filtered signal 306 to produce the signed multi-bit product value. As noted above, a combining operator 310, although conceptually a multiplier, is actually a sign setting operation that requires no multiplication hardware for implementation. An averaging operator 314 may then accumulate the signed multi-bit product values and divide the accumulated sum by a sample count to produce a real power measurement signal 316. Notably, the filter 302 and delay 304 components and resulting multi-bit filtered signal 306 and delayed DSM bitstream signal 308 are already available within the RMS calculator. Therefore, the power calculator 300 may be implemented, in some embodiments, with the addition of just the combining operator 310 and the averaging operator 314.

It will be understood that the above-described RMS calculators may be implemented partly in hardware and partly in software. In some embodiments, the implementation may include one or more field programmable gate arrays (FPGA). In some embodiments, the implementation may include one or more application-specific integrated circuits (ASIC). The selection of particular hardware components may be based upon cost, speed, operating environment, etc. The selection and programming of such components will be within the understanding of a person of ordinary skill in the art having regard to the detailed description provided herein.

In yet a further aspect, the present application discloses a non-transitory computer-readable medium having stored thereon computer-executable instructions which, when executed by a processor, configure the processor to execute any one or more of the processes described above.

Certain adaptations and modifications of the described embodiments can be made. Therefore, the above-discussed embodiments are considered to be illustrative and not restrictive.

What is claimed is:

1. A method of determining root-mean-square of a delta-sigma modulated signal, the method comprising:
   filtering the delta-sigma modulated signal to produce a multi-bit filtered signal;
   delaying a copy of the delta-sigma modulated signal by a fixed number of samples to align with the filtered input;
   setting a sign of each multi-bit value of the multi-bit filtered signal based upon a corresponding sample value of the delayed copy of the delta-sigma modulated signal, to generate a hybrid signal;
   summing the hybrid signal to produce a summed signal; and
   determining the average of the summed signal and the square root of the average to produce a root-mean-square value.

2. The method claimed in claim 1, wherein filtering comprises applying a discrete-time finite impulse response filter to produce the multi-bit filtered signal.

3. The method claimed in claim 2, wherein the discrete-time finite impulse response filter comprises a moving average filter with a rectangular window of tap length L.

4. The method claimed in claim 3, wherein delaying comprises delaying the copy of the delta-sigma modulated signal by L/2 samples.

5. The method claimed in claim 2, wherein the discrete-time finite impulse response filter comprises a multiple-pass moving average filter with rectangular windows for each cascaded moving average filter within the multiple-pass moving average filter.

6. The method claimed in claim 5, wherein the cascaded moving average filters include moving average filters of tap lengths $L=2^n$.

7. The method claimed in claim 1, wherein the multi-bit filtered signal is expressed as:

$$K\left[\frac{1}{L}\sum_{i=n-L+1}^{n} x(i)\right]$$

wherein K comprises an optional gain value, L comprises a tap length of a filter used for filtering, x comprises the delta-sigma modulated signal, and i is a summation index.

8. The method claimed in claim 7, wherein the hybrid signal z[n] is expressed as:

$$z[n] = K\left[\frac{1}{L}\sum_{i=n-L+1}^{n} x(i)\right]\left[x\left(n-\frac{L}{2}\right)\right]$$

wherein the term x(n −L/2) comprises the delayed copy of the delta-sigma modulated signal and has a value of +1 or −1 at each sample.

9. The method claimed in claim 1, wherein no multipliers are used in implementing the filtering, delaying, setting, or summing.

10. A measurement device to determine the root-mean-square of a delta-sigma modulated signal, the device comprising:
    a low-pass filter to filter the delta-sigma modulated signal and output a multi-bit filtered signal;
    a delay path to delay a copy of the delta-sigma modulated signal by a fixed number of samples to align with the multi-bit filtered signal;
    a logic operator to set a sign of the multi-bit filtered signal based on the delayed copy of the delta-sigma signal, to produce a hybrid signal;
    an accumulator to sum the hybrid signal to produce a summed signal; and
    a square root operator to average the summed signal and to output a root-mean-square value as the square root of the averaged summed signal.

11. The device claimed in claim 10, wherein the low-pass filter comprises a discrete-time finite impulse response filter.

12. The device claimed in claim 11, wherein the discrete-time finite impulse response filter comprises a moving average filter with a rectangular window of tap length L.

13. The device claimed in claim 12, wherein the delay path is to delay the copy of the delta-sigma modulated signal by L/2 samples.

14. The device claimed in claim 11, wherein the discrete-time finite impulse response filter comprises a multiple-pass moving average filter with rectangular windows for each cascaded moving average filter within the multiple-pass moving average filter.

15. The device claimed in claim 14, wherein the cascaded moving average filters include moving average filters of tap lengths $L=2^n$.

16. The device claimed in claim 10, wherein the multi-bit filtered signal is expressed as:

$$K\left[\frac{1}{L}\sum_{i=n-L+1}^{n} x(i)\right]$$

wherein K comprises an optional gain value, L comprises a tap length of the low-pass filter, x comprises the delta-sigma modulated signal, and i is a summation index.

17. The device claimed in claim 16, wherein the hybrid signal z[n] is expressed as:

$$z[n] = K\left[\frac{1}{L}\sum_{i=n-L+1}^{n} x(i)\right]\left[x\left(n-\frac{L}{2}\right)\right]$$

wherein the term x(n−L/2) comprises the delayed copy of the delta-sigma modulated signal and has a value of +1 or −1 at each sample.

18. The device claimed in claim 10, wherein no multipliers are used in implementing the filtering, delaying, setting, or summing.

19. A non-transitory processor-readable medium storing program instructions which, when executed, cause one or more processing elements to execute the method claimed in claim 1.

* * * * *